United States Patent [19]
Santangelo et al.

[11] Patent Number: 6,159,805
[45] Date of Patent: Dec. 12, 2000

[54] SEMICONDUCTOR ELECTRONIC DEVICE WITH AUTOALIGNED POLYSILICON AND SILICIDE CONTROL TERMINAL

[75] Inventors: Antonello Santangelo, Belpasso; Giuseppe Ferla, Catania, both of Italy

[73] Assignee: STMicroelectronics S.r.l., Agrate Brianza, Italy

[21] Appl. No.: 09/158,946

[22] Filed: Sep. 21, 1998

Related U.S. Application Data

[63] Continuation of application No. 08/664,359, Jun. 17, 1996, Pat. No. 5,811,335.

[30] Foreign Application Priority Data

Jun. 16, 1995 [EP] European Pat. Off. ............. 95830249

[51] Int. Cl.$^7$ .................... H01L 21/336; H01L 21/423
[52] U.S. Cl. .................... 438/268; 438/270; 438/273; 438/527; 438/529
[58] Field of Search .................... 438/133, 138, 438/268, 302, 525, 156, 192, 273, 270, 274, 589, 529, 527

[56] References Cited

U.S. PATENT DOCUMENTS

| | | | |
|---|---|---|---|
| 4,819,037 | 4/1989 | Sakakibara et al. | 357/4 |
| 4,883,767 | 11/1989 | Gray et al. | 437/41 |
| 5,171,705 | 12/1992 | Choy | 437/41 |
| 5,338,693 | 8/1994 | Kinzer et al. | 437/29 |
| 5,393,685 | 2/1995 | Yoo et al. | 437/44 |
| 5,589,408 | 12/1996 | Robb et al. | 437/29 |
| 5,811,335 | 9/1998 | Santangelo et al. | 438/268 |
| 5,814,859 | 9/1998 | Ghezzo et al. | 257/335 |
| 5,817,546 | 10/1998 | Ferla et al. | 438/268 |
| 5,981,343 | 11/1999 | Magri et al. | 438/268 |
| 6,043,126 | 3/2000 | Kinzer | 438/273 |
| 6,069,384 | 5/2000 | Hause et al. | 257/330 |

FOREIGN PATENT DOCUMENTS

| | | |
|---|---|---|
| 0 393 949 | 10/1990 | European Pat. Off. . |
| 3-49238 | 3/1991 | Japan . |
| 3-175643 | 7/1991 | Japan . |

OTHER PUBLICATIONS

Shenai et al., "High–Performance Vertical–Power DMOS-FETs with Selectively Silicided Gate and Source Regions," *IEEE Electron Device Letters*, 10(4) pp. 153–155, 1989.

Murao et al., "A High Performance CMOS Technology with Ti–Silicided P/N–Type Poly–SI Gates," *International Electron Devices Meeting*, Technical Digest, Washington D.C., pp. 518–521, 1983.

Narita et al., "A High–Speed 1–Mbit EPROM with a Ti–Silicided gate," *IEEE Transactions on Magnetics* SC20, No. 1, pp. 418–421, 1985.

Wolf, "Silicon Processing For The VLSI Era vol. I: Process Technology," Lattice Press, 1986, pp. 188–189.

Ghandhi, "VLSI Fabrication Principles Silicon and Gallium Arsenide," Second Edition, John Wiley & Sons, Inc., 1994, pp. 551–553, 608–610 and 629–633.

*Primary Examiner*—Amir Zarabian
*Assistant Examiner*—Michael S. Lebentritt
*Attorney, Agent, or Firm*—Theodore E. Galanthay; E. Russell Tarleton; Seed IP Law Group PLLC

[57] ABSTRACT

An electronic semiconductor device (20) with a control electrode (19) consisting of self-aligned polycrystalline silicon (4) and silicide (12), of the type in which said control electrode (19) is formed above a portion (1) of semiconductor material which accommodates active areas (9) of the device (20) laterally with respect to the electrode, has the active areas (9) at least partially protected by an oxide layer (10) while the silicide layer (12) is obtained by means of direct reaction between a cobalt film deposited on the polycrystalline silicon (4) and on the oxide layer (10). (FIG. 9)

16 Claims, 8 Drawing Sheets

SEMICONDUCTOR ELECTRONIC DEVICE WITH AUTOALIGNED POLYSILICON AND SILICIDE CONTROL TERMINAL

CROSS-REFERENCE TO RELATED APPLICATION

This application is a continuation of U.S. patent application Ser. No. 08/664,359, filed Jun. 17, 1996, now U.S. Pat. No. 5,811,335.

TECHNICAL FIELD

This application claims priority from EPC application 95830249.9, filed Jun. 16, 1995, which is hereby incorporated by reference.

BACKGROUND AND SUMMARY OF THE INVENTION

The present invention relates to fabrication of semiconductor power devices.

More particularly the invention relates to fabrication of devices wherein a control electrode of silicided polysilicon is formed above a portion of semiconductor material which is laterally offset from source and DMOS channel regions of the device.

The invention relates also to a process for providing a semiconductor device with a control electrode consisting of self-aligned silicide and polycrystalline silicon, of the type in which said silicide layer is formed above the polycrystalline silicon following definition of active areas of the device formed on a portion of semiconductor material laterally with respect to said control electrode.

In the specific technological sector of the present invention it is well-known to use polycrystalline silicon or polysilicon to form the gate electrode of field-effect semiconductor devices, for example MOS transistors, which are also provided with source electrodes and drain. In the case of a vertical-current-flow DMOS device, the drain is not located at the front surface of the device.

Polycrystalline silicon offers several advantages compared to other materials and can be used to form both logic and analog integrated circuits as well as power devices.

Particularly with reference to power devices, it is known that they are formed by means of a multicellular structure which is derived from the ordered repetition of a basic cell. This cell can have a square, rectangular or hexagonal structure or any other suitable shape which is normally defined by means of openings formed in the polycrystalline gate electrode.

The power device can therefore be regarded as the result of a parallel connection of a large number of basic cells. In this context, the polycrystalline silicon gate electrode of each basic cell represents a first level of interconnection which is electrically insulated from an overlying metallization layer by means of an intermediate dielectric layer.

The metallization layer generally consists of aluminum and permits the formation of a source electrode which collects all the current which passes through the device, connecting together all the basic active areas. A small portion of the metallization area is used for biasing the gate electrode; this portion is separated by means of photolithographic techniques from the source electrode and is placed in direct contact with the polycrystalline silicon layer.

It is also well-known that the gate electrode is electrically insulated with respect to the underlying semiconductor substrate by means of a thin layer of silicon oxide. By varying the voltage of the gate electrode with respect to the source electrode it is possible to regulate conduction of the electronic device.

According to the physical principles which govern the operation of MOS devices, a capacitance which is not constant is present between the gate electrode and the source electrodes and drain. This parasitic capacitance requires a certain quantity of charge so that its potential can be varied.

The charge is supplied or recalled by an external circuit driving the gate electrode; in MOS power devices, the quantity of charge variation can be reach or exceed a few hundred nanocoulombs.

In order to obtain fast MOS devices, it is necessary to bias the gate electrode rapidly and uniformly. The commutation speed of these devices depends in fact also on the rapidity of changing the voltage of the gate, in particular for frequencies greater than 100 kHz. However, the gate electrode is subject to an RC time constant determined by the parasitic capacitance and parasitic series resistance of the gate electrode structure itself.

On account of the high resistivity of the polycrystalline silicon ($\rho$=2–6 m$\Omega$-cm) with respect to the distributed capacitance, the gate electrode during the commutation transient does not reach immediately and uniformly the same potential which is applied from outside via the driving circuit. Consequently, there will be a certain delay during charging up of the entire electrode; this delay will be all the more accentuated, the greater the distance between the basic cell and the contact termination of the metal gate electrode.

In an attempt to speed up and render uniform the polarization phase, the known art proposes a first solution which consists in sacrificing a part of the active area of the device in order to form an aluminum gate termination of suitable shape extending over most of the polycrystalline silicon area.

This particular aluminum termination normally assumes a fingered configuration and makes it possible to achieve a continuous contact with the underlying polycrystalline silicon layer.

Although advantageous in various respects, this solution does not resolve entirely the problem of speeding up the MOS devices and has the drawback that it requires active area to be sacrificed and places constraints on the topography of the metallization structure owing to the presence of the gate fingers.

A second solution proposed by the known art consists in attempting to reduce the sheet resistance of the polycrystalline silicon, forming above it a layer of a metal silicide.

Owing to the low resistivity of silicide ($\rho$=17–150 $\mu\Omega$-cm) compared to that of polysilicon and owing also to its greater thermal and chemical stability compared to pure metals, it is possible to integrate the suicides in the semiconductor devices into an intermediate phase of the production process; that is to say into a phase following which further heat treatments are envisaged.

Tungsten silicide is the material normally used for forming the silicide layer above the polycrystalline silicide by means of chemical vapor deposition (CVD) techniques.

The tungsten silicide cannot be obtained from the reaction between a tungsten film and the silicon, but it is necessary to deposit simultaneously both the atom species, tungsten (W) and silicon (Si).

This means that, contrary to that which occurs in the case of silicides obtained from the reaction of a metal film with silicon, the tungsten silicide layer must be defined by means of a photolithographic process. For this reason, the tungsten silicide layer is deposited after the polysilicon layer, then proceeding with etching of both the layers so as to obtain self-alignment.

Tungsten silicide, however, has disadvantages, one of which is a high resistivity ($\rho$=100–150 $\mu\Omega$-cm) which keeps the sheet resistance of the gate electrode high.

Moreover, as already mentioned above, the silicide is deposited onto the surface of the polysilicon before both the layers are defined by a photolithographic process. However, the MOS power devices are subjected to ion implantation and heat diffusion phases also following definition of the gate electrode. In particular, in the case of MOS power devices, the formation of the body and source junctions takes place following definition of the gate electrode and the presence of tungsten silicide on the surface of the polysilicon imposes some constraints on the production processes.

The known art has therefore proposed the use of alternative materials such as titanium silicide ($TiSi_2$) or cobalt silicide ($CoSi_2$), which have resistivities of between 17 and 20 $\mu\Omega$-cm.

These silicides are normally obtained by reaction of a metal film with the silicon and are also defined "self-aligned" in that the reaction between the metal film deposited and the silicon takes place only when the two materials are brought into close contact. Consequently, if the semiconductor substrate is protected by an oxide layer in which some openings have been formed, then the formation of the compound will occur only inside these openings.

Titanium silicide and cobalt silicide have been proposed for the formation of structures such as that illustrated in FIG. 1.

This figure shows the basic cell of a MOS power device during an intermediate phase of the formation process, where a silicide layer is grown above the polysilicon gate electrode and also above the monocrystalline silicon regions.

The silicide layer is also used for the formation of ohmic contacts with the monocrystalline silicide above the active areas or regions of monocrystalline silicon. In order to ensure, however, insulation between the gate electrode and these active regions, oxide spacers have been provided along the perimeter of the electrode so as to prevent the formation of silicide on the side walls of the polysilicon.

On account of the chemical reaction between the metal and the semiconductor, which gives rise to the formation of silicide, the excess metal on the walls of the spacer may give rise to the formation of a metal compound with the silicon. The latter may in fact spread from the polycrystalline or monocrystalline region towards the side wall of the spacer.

This phenomenon, which has been extensively studied, is known in the literature as "lateral rising", and may be the cause of a short-circuit between the two layers of silicide deposited respectively above the polysilicon and above the active areas.

The danger of short-circuiting is due to the fact that the metal compound which rises up the spacers cannot be etched selectively with respect to the silicide, unlike that which is possible in the case of pure metal. If the metallic compound grown on the side wall of the spacer manages to electrically connect the two electrodes at any point on the perimeter, then the device will not function.

Therefore, the formation of the silicide on the surface of the monocrystalline silicon may be damaging on account of the phenomenon of lateral rising.

This fact must be duly taken into account when designing a MOS-type power device since, for reasons associated with the efficiency of the device, the channel perimeter which coincides substantially with that of the spacers tends to be maximized. In doing so, however, there may be a very high probability of a short-circuit occurring owing to the phenomenon of lateral rising, to the extent that the efficiency will be reduced.

Moreover, in a MOS power device, typically an N-channel MOS device, the formation of the silicide in the contact regions may be superfluous or deleterious, since the dimensions of the contacts are rarely less than a few microns. With dimensions of this order of magnitude, normal metallization with aluminum already enables a good ohmic contact to be formed both to n+ type semiconductors (for example the source region) and to the p-type semiconductors (for example the body region).

Instead, most of the suicides useful for these applications have the special characteristic that they produce a slight depletion of dopant atoms in the semiconductor near the silicide/silicon interface. This phenomenon has the effect of increasing the specific contact resistance between the silicide and the semiconductor.

This is particularly important for the p-type region (body) present inside the cell of an N-channel MOS transistor, or in the p-type region (emitter) in the case of an IGBT transistor. In the particular case of the MOS device, the body region forms the anode of a body/drain diode and this junction is used in some circuit applications as a "recirculation diode"; therefore, the drop in potential at its terminals when it is forward biased must be less than a predetermined value which depends on the type of device.

Self-aligned silicides could, owing to their low resistivity, be used in place of tungsten silicide by growing these materials soon after the deposition of the layer of polycrystalline silicon. Subsequently, via a photolithographic process, openings in the gate electrode may be defined. However, since these materials have a thermal stability which is lower than that of tungsten silicide, their integrity would be affected by the subsequent heat processes required for completion of the device.

The technical problem underlying the present invention is that of devising a semiconductor device, in particular a field-effect power device, having structural and functional characteristics such as to enable a control electrode consisting of self-aligned silicide and polycrystalline silicon to be obtained, overcoming the limitations and/or the drawbacks indicated previously with respect to the known art.

The present application discloses the novel idea of forming a gate electrode with a double layer of polysilicon and cobalt silicide, the latter being obtained by means of a direct reaction between cobalt and silicon precisely and only in the region of the gate electrode, while the active areas of the device are protected from this reaction.

The silicide is preferably cobalt silicide, which has a low resistivity value (between 17 and 20 $\mu\Omega$-cm). Cobalt silicide has been found to be highly preferred over titanium silicide, for the following reasons:

Titanium reacts strongly with oxygen (so much so that in the field of ultra high vacuum apparatus titanium has been used to implement pumps to improve the vacuum conditions). This implies that the deposition of titanium must be done using equipment which would provide a very high base vacuum level, to avoid inclusion of oxygen in the interior of the film. Cobalt, being a metal of the "near noble" class, does not present this inconvenience.

For the same reasons, the ambient within which the reaction between the metal and silicon is performed ("RTA," i.e. rapid thermal annealing) must, in the case of titanium, be extremely tightly controlled. Very small percentages of oxygen can indeed oxidize the surface of the metal or directly inhibit the reaction necessary for formation of the silicide.

The silicide of cobalt ($CoSi_2$) is more thermally stable. That is, this material, as compared with titanium silicide, is less susceptible to the phenomenon of "balling up." This phenomenon appears when a silicide film is exposed to high temperature processes, particularly if the silicide film was grown from a layer of polycrystalline silicon. At high temperature the individual grains of the silicide separate, and assume the shape of microspheres which are included in the interior of the semiconductor. This has the effect of significantly increasing the sheet resistance of the film, since the film is no longer continuous. Obviously this phenomenon is disadvantageous in all those applications where the silicide film is used to reduce the sheet resistance of an underlying film of polycrystalline silicon. The thermal budget item which can be very inconvenient in general is the high-temperature time necessary for reflowing the dielectric layer. (layer 13 in FIG. 9). This procedure serves to soften the topology resulting from the sidewall of the patterned polysilicon layer, so as to provide more margin for the metallization process. To facilitate the reflow of the interlevel dielectric, it is well known that phosphorus doped oxide (PVAPOX) or borophosphosilicate glass (BPSG) can be used.

The aluminum source metallization is normally doped with silicon, because the metal is in direct contact with the semiconductor source and body regions. This alloy serves to eliminate the well known phenomenon of spiking, where aluminum intrusions may perforate the underlying junctions. However, this alloy incurs problems when deposition temperatures above 350 to 400 degrees C. are used. Such temperatures are necessary to provide optimal step coverage of the metallization over the topographical gradients present in the underlying structure. However, under such deposition conditions there have been measured an excessive number of silicon precipitates (derived from the silicon originally present in the alloy), which are type P+ due to aluminum doping, and which can partially block the contact. For this reason the deposition temperature must be maintained below 300 degrees C., and moreover the underlying structure must not present any sharp topography.

Nevertheless, the process of reflow is very important, and cannot be done in a furnace, since the duration of heating will degrade the characteristics of the silicide.

After vapor-phase deposition of vapox/BPSG (BPSG is the material which reflows at the lowest temperature) over the sharp slopes due to the side walls of the polysilicon layer, the as-deposited angles will actually be negative (in relation to the normal from the surface of the semiconductor and the tangent to the side wall of the polysilicon). In the example of FIG. 12, this angle is −20°. This prejudices the step coverage of the metallization, and a reflow process is therefore necessary.

The reflow can be performed under RTA conditions, and it has been experimentally confirmed that, in order to use metal deposition temperatures around 200 degrees C., the reflow must attain positive angles greater than 20 degrees. From the experimental graph of FIG. 13 attached, where this angle is shown as a function of temperature, it may be seen that reflow temperatures must be at least 950 degrees to obtain such angles. Such temperatures, as seen in FIG. 11, are dangerously close to the stability limit of titanium silicide.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
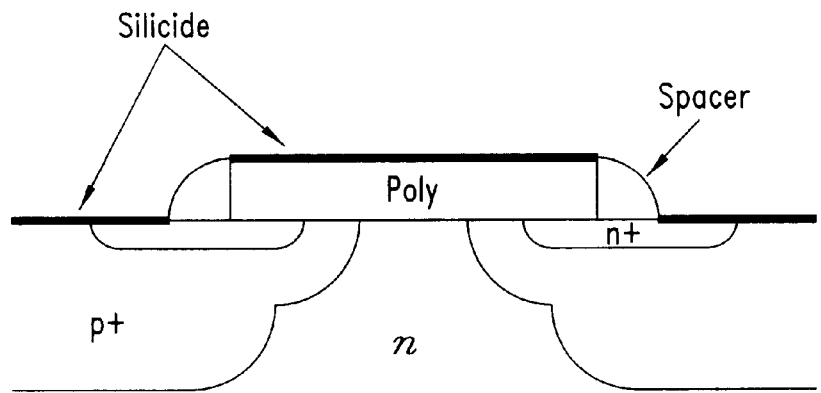
FIG. 1 shows a schematic view, in vertical section, of a basic cell of an electronic semiconductor device during an intermediate phase of formation according to the known art.

The numerous innovative teachings of the present application will be described with particular reference to the presently preferred embodiment (by way of example, and not of limitation), in which:

With reference to these figures, 1 denotes an epitaxial layer formed in a conventional manner on a substrate of semiconductor material, for example n+ type monocrystalline silicon.

In the epitaxial layer 1 there is defined a deep-body region 2 inside which active areas 9 of an electronic device 20 according to the present invention will be formed.

FIGS. 2 to 10 show substantially respective views, in vertical section, of a portion of semiconductor material on which a basic cell according to the invention is formed.

A thin layer 3 of gate oxide is grown above the epitaxial layer 1.

A polycrystalline or polysilicon layer 4 is deposited above the oxide layer 3 over a thickness of about 5000 Angstroms (Å). This layer 4 is n+ doped via an ion implantation or by means of oven preparation so as to obtain a concentration of dopant of the order of $10^{19}$ atoms/cm$^3$.

A subsequent oxidizing heat process allows the growing of a thin layer 5 of oxide, of the order of 150 Å, onto which a layer 6 of silicon nitride of about 1000 Å is deposited.

The growth of the oxide 5, 150 Å thick, can also be avoided by depositing the layer 6 of nitride directly onto the surface of the polycrystalline silicon. This choice depends on the type of equipment used for etching, in sequence, the nitride 6 and the polycrystalline silicon 4. The absence of the oxide 5 is preferable for better control of the self-alignment between silicide and polysilicon.

Figure 2:
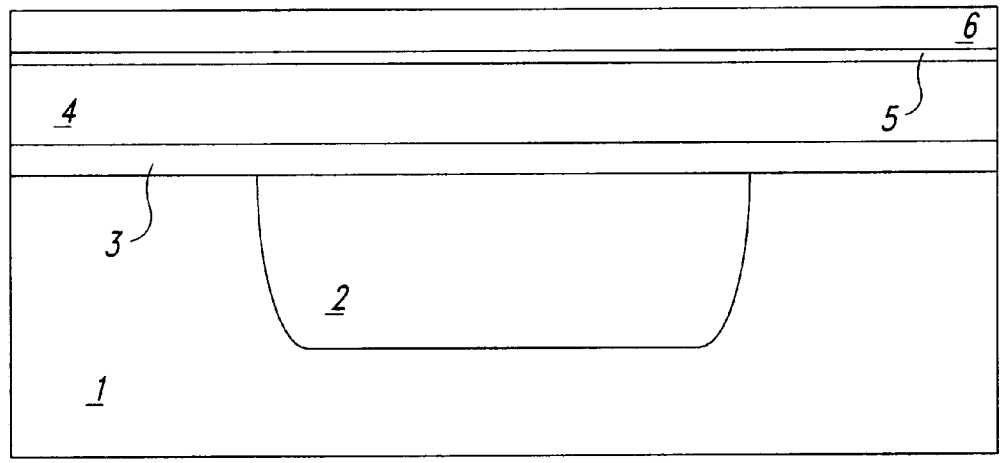
FIG. 2 shows a schematic view, in vertical section, of a portion of semiconductor material on which a basic cell of an electronic device according to the present invention is formed.

FIG. 2 schematically illustrates this basic structure on the basis of which the device according to the invention is obtained.

Figure 3:
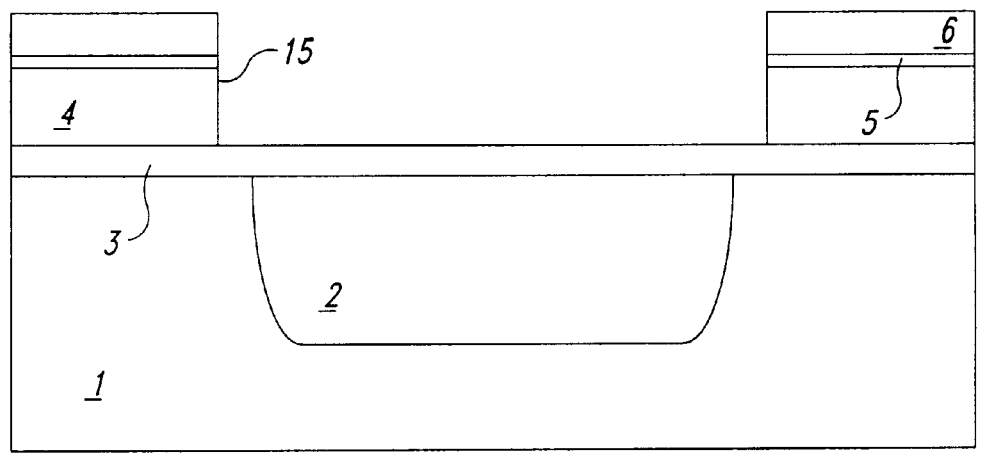
FIGS. 3 to 8 show respective schematic views of the portion of semiconductor material according to FIG. 2 during subsequent phases of the production process resulting in formation of the device according to the invention.

Referring now to FIG. 3, the process which results in the formation of the device according to the invention envisages the definition of an opening 15 having, in plan view, a square, rectangular or hexagonal shape. The opening 15 is defined by means of a common photolithographic process which etches the nitride layer 6, the thin oxide 5, if it is present, and the polysilicon 4 until the gate oxide 3 is revealed.

At this point, an implantation of boron at a dosage of between $10^{13}$ and $10^{14}$ ions/cm$^2$ and subsequent diffusion make it possible to obtain a surface well 7 which extends laterally with respect to the deep-body region 2. The well 7 is necessary for the formation of a channel region underneath the gate electrode 19 of the basic cell 20.

Figure 4:
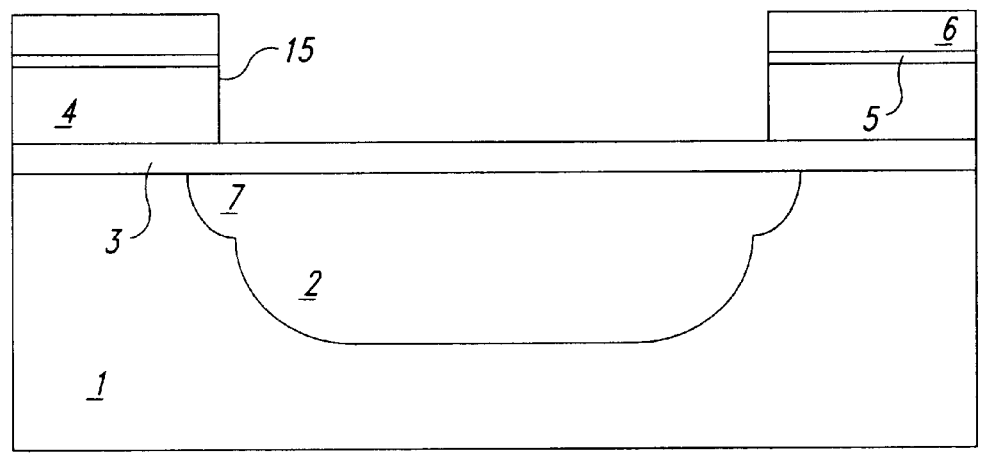

The well 7 is clearly visible in FIG. 4 and, in a preferred embodiment, is of the P-type for the formation of N-channel MOS devices.

Inside the opening 15, in a practically central position, a masking 16 is formed with a layer 8 of photosensitive material, for example photoresist.

Subsequent selective etching on the sides of the masking 16 enables portions of gate oxide 3 inside the opening 15 to be removed, revealing the surface of the semiconductor material belonging to the wells 7.

Figure 5:
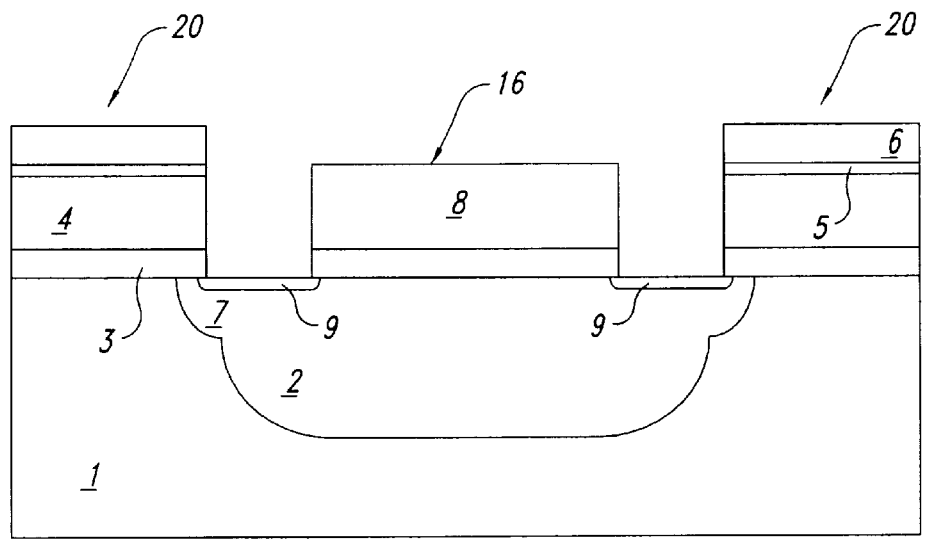

An implantation of arsenic ions enables the formation of active n+ doping areas 9 shown in FIG. 5. These areas 9, after a suitable diffusion phase, define the source region associated with each basic cell 20.

This latter diffusion phase is performed after removal of the layer 8 of photoresist and is advantageously performed in an oxidizing environment so to enable the growth of a layer 10 of oxide of about 1500 Å thickness on the uncovered regions of the semiconductor.

The surface of the polysilicon 4 does not undergo oxidation since it is protected by the nitride layer 6.

Figure 6:
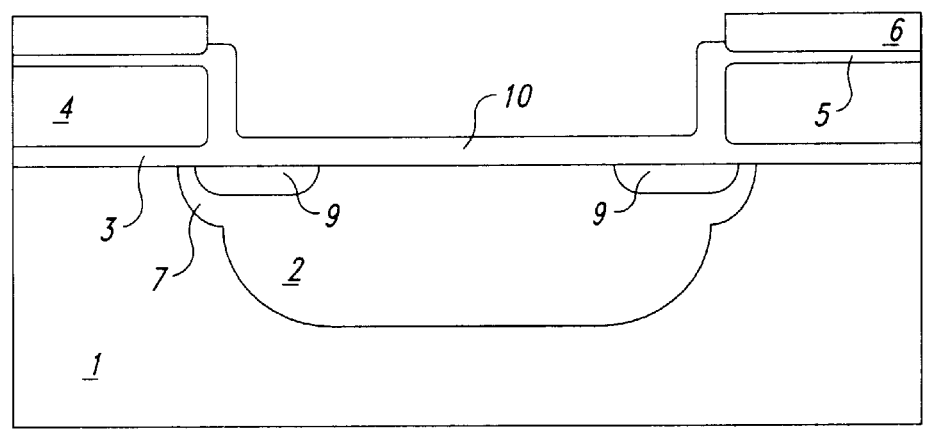

The resultant structure following growth of the oxide 10 is shown in FIG. 6.

Figure 7:
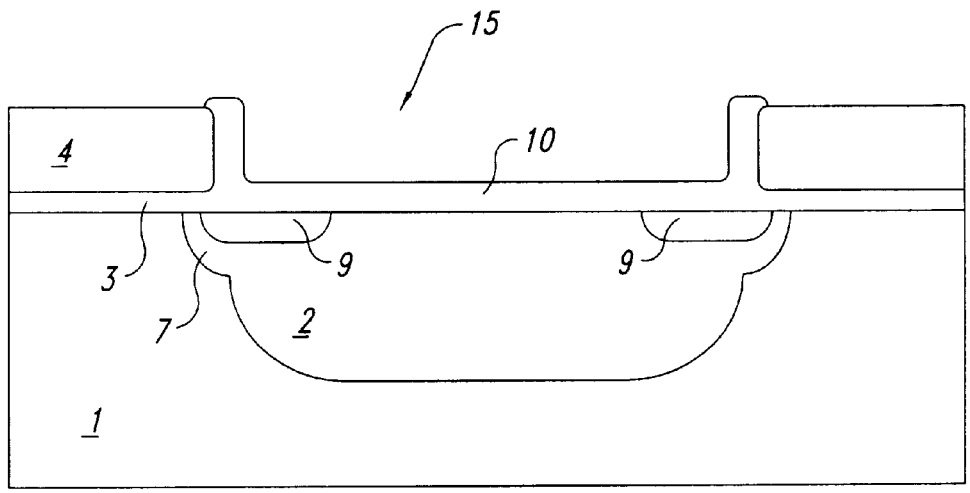

At this point, selective etching of the nitride 6 with respect to the thermal oxide and brief etching of the oxide makes it possible to remove the thin layer 5, if it is present, and expose the entire surface of the polysilicon, except for the portion inside the opening 15 still protected by the oxide layer 10, as shown in FIG. 7.

This process phase is self-aligned with the polysilicon layer 4 and does not require additional phototechniques or masks.

Figure 8:
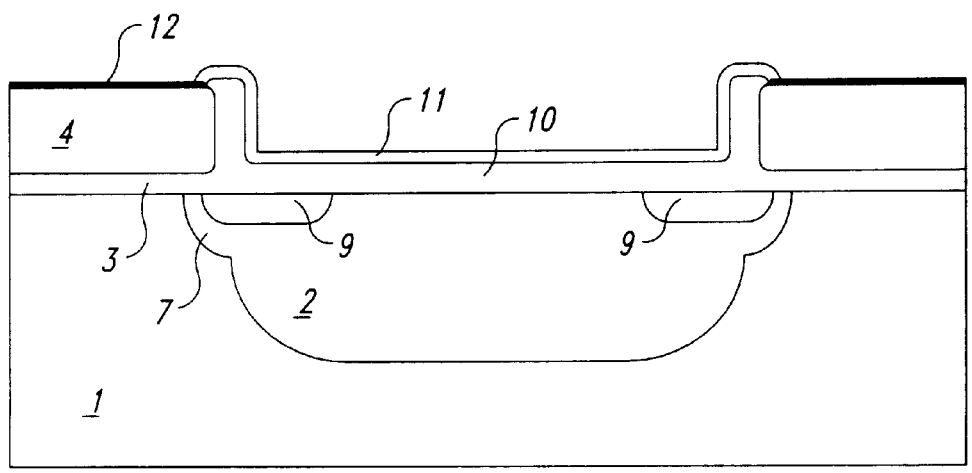

Now, a metal layer 11 is deposited over the entire device so that the reaction of the metal with the polysilicon gives rise to the selective formation of a silicide layer 12, as shown in FIG. 8.

The metal layer 11 is preferably formed with cobalt silicide, which has a low resistivity value (between 17 and 20 $\mu\Omega$-cm). Cobalt silicide has been found to be highly preferred over titanium silicide, for the reasons noted above.

To confirm the advantages of cobalt silicide as compared with titanium silicide, a series of experiments was performed subjecting these materials to rapid thermal processes in the interior of an RTA apparatus. In both cases, the silicide was grown on a uniform layer of polysilicon (doped with arsenic) deposited over oxide. In attached FIG. 11, the x axis shows the temperature of annealing, while the y axis shows the sheet resistance of the silicide film after the thermal treatment, normalized to the value of the as-grown film before the thermal cycle. From FIG. 11 it may be seen that the titanium silicide film begins to degrade at temperatures of 1000° C. or less, while cobalt silicide does not begin to degrade until about 1100° C.

This difference is extremely important, since the phenomenon of "balling up" produces, in addition to the increase in sheet resistance, silicide intrusions into the interior of the gate polysilicon, which can damage the underlying gate oxide.

The chemical reaction between metal and semiconductor is caused by a heat process, and is inhibited only above the regions protected by the oxide layer 10.

The metal layer 11 not reacted above the oxide surface 10 is selectively removed and a subsequent deposition enables an intermediate dielectric layer 13 covering the entire device to be obtained.

In the presently preferred embodiment, the dielectric 13 is composed of two layers, 8000 Å of BPSG over 2000 Å of Vapox (undoped $SiO_2$). The layer of undoped $SiO_2$ provides a buffer to prevent the BPSG from introducing dopants into the underlying semiconductor region. The two layers are deposited in sequence in an atmospheric CVD process, using a Watkins Johnson 999R. In the first process chamber $O_2$, silane ($SiH_4$), and nitrogen are introduced to deposit the undoped oxide layer. In the second and third chambers phosphine and diborane are added to the mixture (with oxygen, silane, and nitrogen) to deposit the BPSG. In the presently preferred embodiment, the mixture is adjusted to deposit BPSG with 4% wt of phosphorus and 3% wt of boron.

Figure 9:
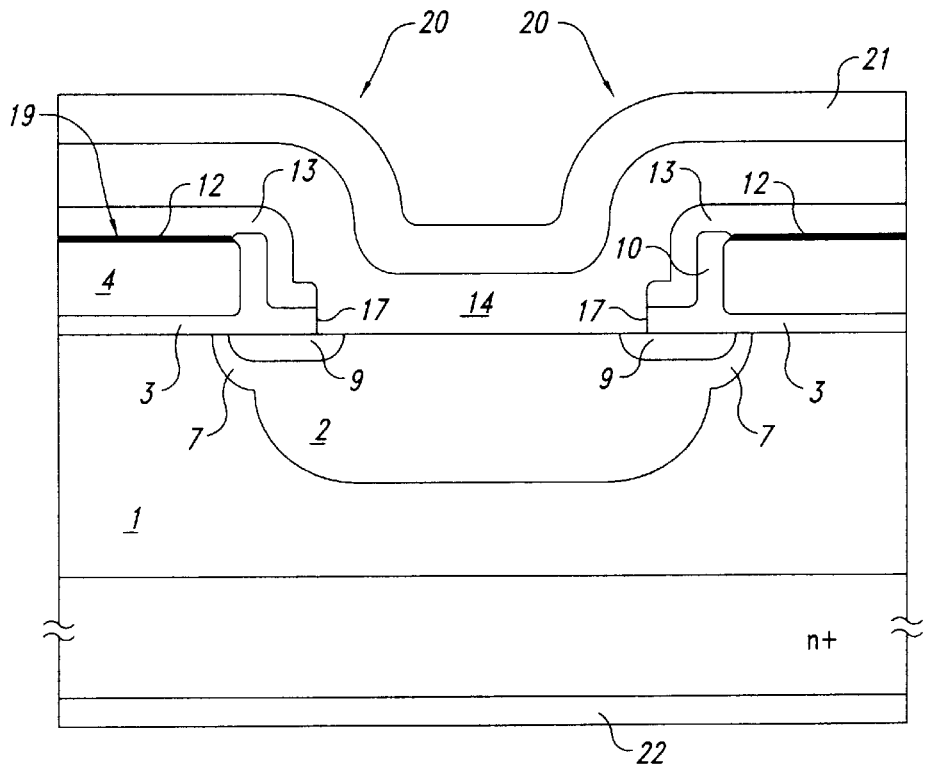
FIG. 9 shows a schematic view, in vertical section, of an electronic semiconductor device formed according to the present invention.

A new opening 17 is defined through this dielectric layer 13 and the thin oxide 10 by means of photolithographic process. Via this opening 17, the source region 9 and body region 2 are reached; the deposition of an aluminum contact layer 14 enables the source current of each device 20 to be collected, as shown in FIG. 9, connecting together all the source terminations of all the basic devices.

Preferably the source metallization is an aluminum alloy (Al:Si), with a silicon content in the range of 1% to 2%, and is deposited at a peak temperature below 300° C. Preferably the RTP dielectric reflow operation provides a maximum sidewall slope of +20°, with no undercuts.

Figure 12:
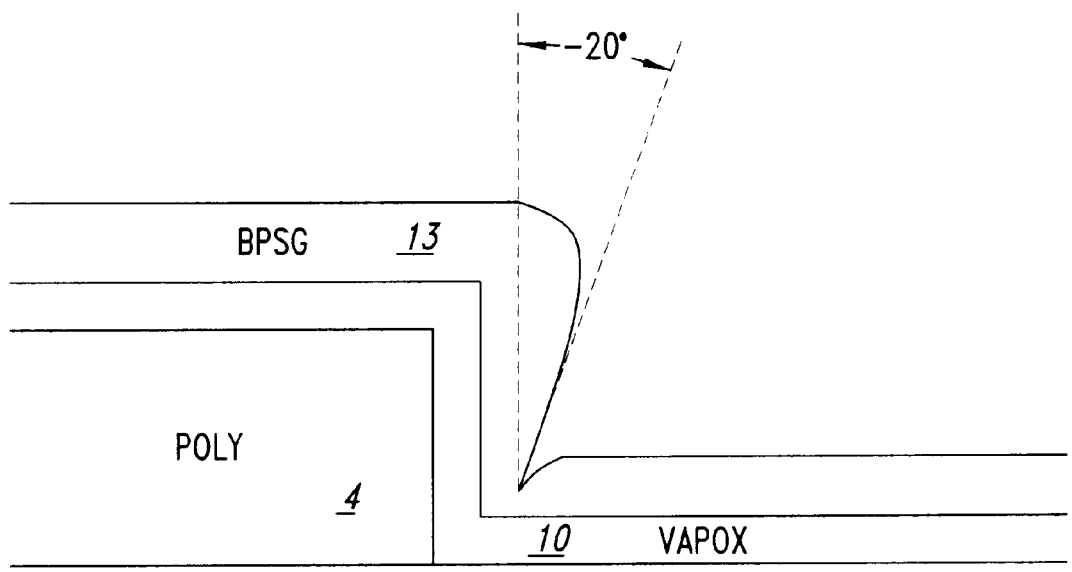
FIG. 12 shows how as-deposited BPSG, over a vertical edge, can assume a "breadloaf" profile with a negative (overhung) sidewall slope.

As shown in FIG. 12, over the sharp slopes due to the side walls of the polysilicon layer, the as-deposited angles will actually be negative (in relation to the normal from the surface of the semiconductor and the tangent to the side wall of the polysilicon). In the example of FIG. 12, this angle is −20°. This prejudices the step coverage of the metallization, and a reflow process is therefore necessary.

Figure 11:
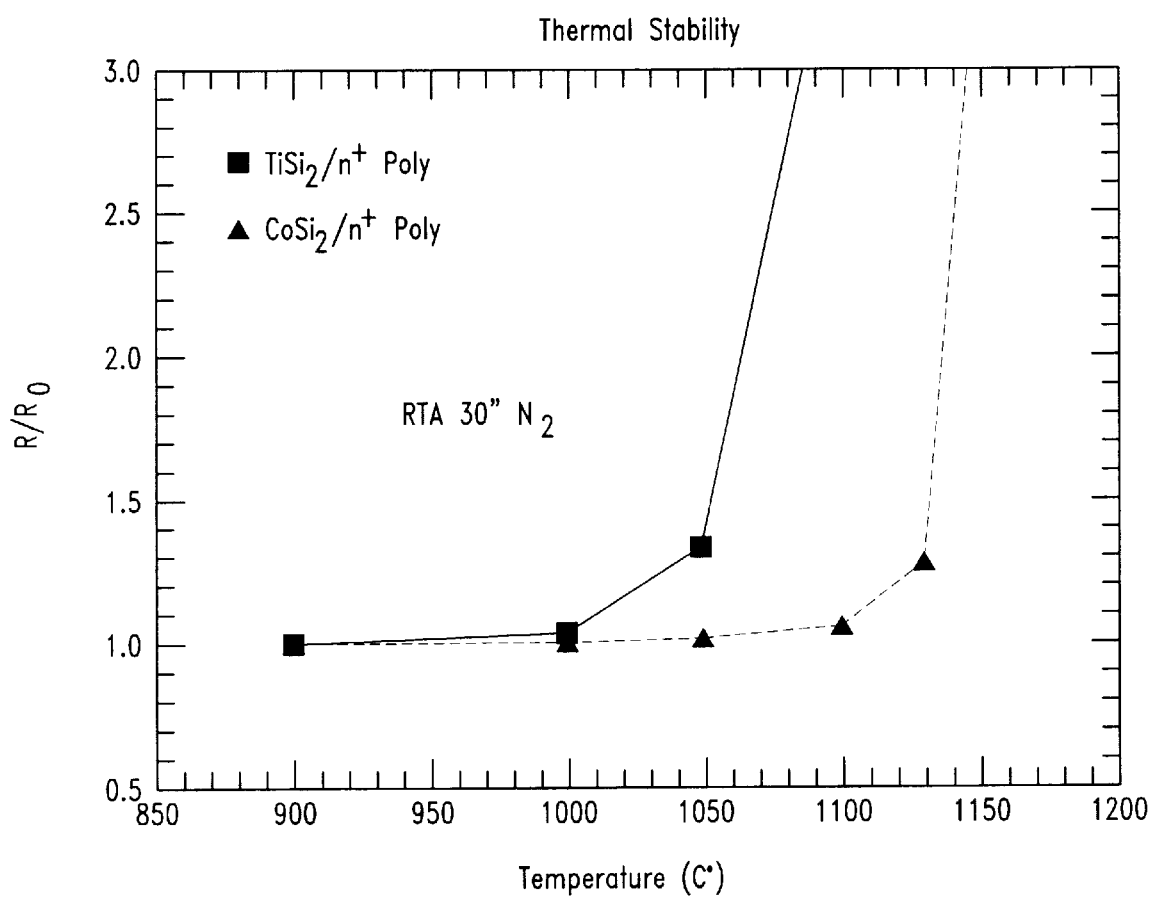
FIG. 11 shows thermal dependence of the degradation of resistivity of titanium and cobalt silicides.
Figure 13:
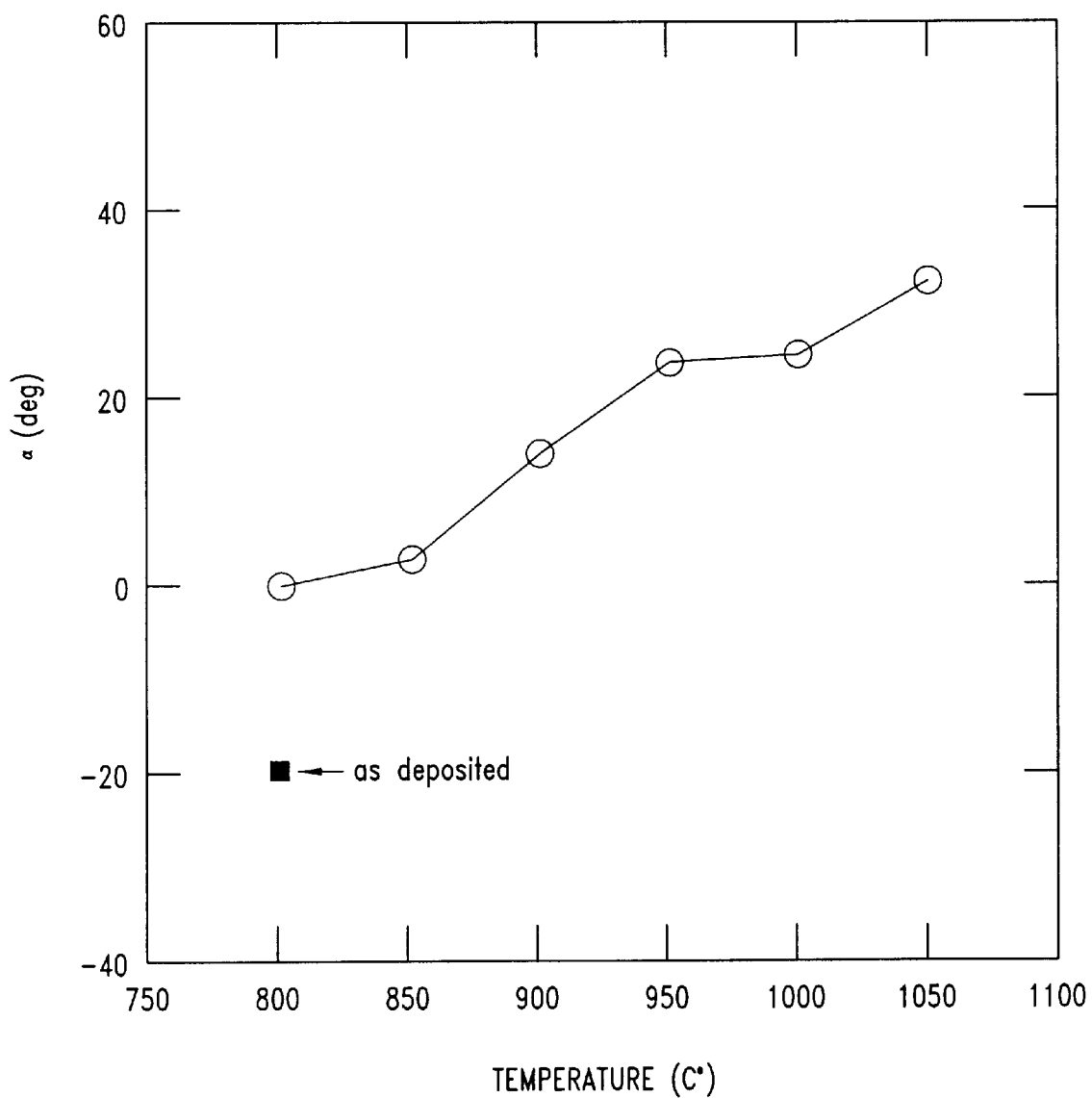
FIG. 13 shows how various annealing temperatures will change the sidewall angle of the as-deposited material of FIG. 12.

The reflow can be performed under RTA conditions, and it has been experimentally confirmed that, in order to use metal deposition temperatures around 200 degrees C., the reflow must attain positive angles greater than 20 degrees. From the experimental graph of FIG. 13 attached, where this angle is shown as a function of temperature, it may be seen that reflow temperatures must be at least 950 degrees to obtain such angles. Such temperatures, as seen in FIG. 11, are dangerously close to the stability limit of titanium silicide.

The device is then completed with a phase involving a photographic technique applied onto the aluminum surface so as to define the metal source and gate electrodes, not shown in FIG. 9.

Moreover, a dielectric layer 21 is deposited in order to passivate the surface of the device. This layer 21 is removed only in the region of the pad areas via which the device is connected to the interconnecting wires during package assembly.

The drain contact is formed on the rear of the device by means of a metallization layer 22 formed according to the known art.

A valid alternative to the production process described above consists in avoiding the use of deep-body diffusions 2. This makes it possible to simplify the formation of the devices 20 by simply increasing the dose and the energy of the boron implantation necessary for formation of the p-type wells 7.

Figure 10:
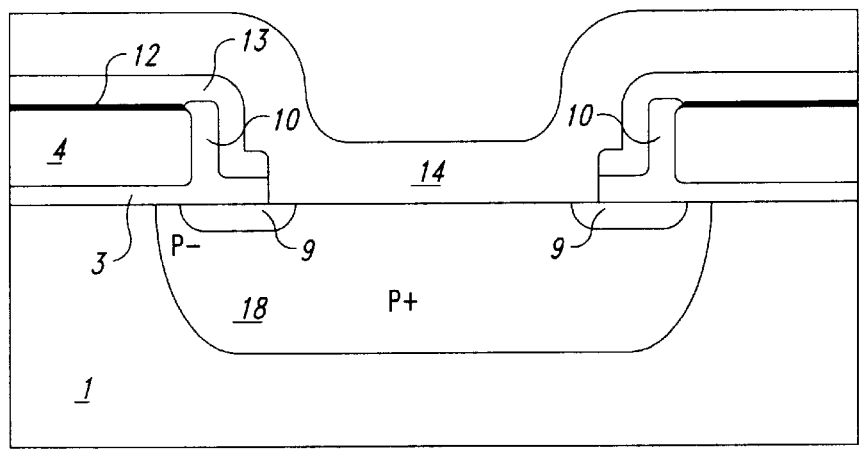
FIG. 10 shows a schematic view, in vertical section, of a second embodiment of an electronic semiconductor device according to the invention.

In this way a single P+ type region 18, shown in FIG. 10, is obtained, having a sheet resistance comparable with that of the process which uses the deep-body diffusion 2 and with a concentration of dopant in the channel region which is nevertheless adequate for correct operation of the device.

The structure of the resulting device is therefore entirely identical to that described previously with the only substantial difference that there is no longer the diffusion 2 shown in FIG. 2 and instead there is an extensive region 18 as shown in FIG. 10.

This modified embodiment is also effective for preventing the turn-on of a parasitic npn bipolar transistor which is always present in the vicinity of the channel region and which tends to start conducting during the commutation transients.

The device according to the invention resolves the technical problem and achieves numerous advantages indicated hereinbelow.

The MOS power device according to the invention is provided with a gate electrode with a double polysilicon/silicide layer having a low sheet resistance.

This compound is obtained directly by the reaction of a cobalt film with the polycrystalline semiconductor and, therefore, the resistivity of the silicide thus obtained can even be a tenth of that of tungsten silicide.

The reaction between metal film and the polysilicon occurs exclusively on the surface of the gate electrode, while the active areas of the device are covered with an oxide which inhibits this reaction.

The resultant silicide structure is of the type self-aligned with polysilicon and no additional photolithographic phase is necessary in order to obtain this result.

The fact that above the active areas there is no formation of silicide means that it is possible to avoid the presence of spacers and hence the dangerous possibility of short-circuits due to the phenomenon of "lateral rising".

The main effect of the reduction in the sheet resistance of the gate electrode is that of making the device two to four times faster during the turn-off phase, thus reducing the power dissipated during commutation. This advantage is particularly important in applications where a high commutation speed is required.

Moreover, the structure of the device according to the invention makes it possible to reduce the intensive use of aluminum interconnections for the gate electrode. The latter reduce the active area of the device, complicating the circuit layout and the design thereof.

According to a disclosed class of innovative embodiments, there is provided: A device fabrication method, comprising the steps of: fabricating a structure which includes semiconductor source regions, and differentially-diffused semiconductor channel regions, and a layer of polysilicon material overlying said channel regions and capacitively coupled thereto through a gate dielectric; reacting said polysilicon material with cobalt to form a cobalt silicide layer on said polysilicon material only, and not over other portions of said structure; etching said polysilicon material in a pattern which includes transistor gate electrodes; depositing an interlevel dielectric over said polysilicon material; and reflowing said interlevel dielectric, using rapid thermal annealing at a peak temperature of at least 900° C., to provide a smoothed upper surface.

According to another disclosed class of innovative embodiments, there is provided: A device fabrication method, comprising the steps of: fabricating a structure which includes semiconductor source regions surrounded by semiconductor body regions, said body regions including channel regions which are at least partially self-aligned to said source regions; and a layer of polysilicon material overlying said channel regions and capacitively coupled thereto through a gate dielectric; depositing cobalt on said polysilicon material, but not on said source and body regions, and reacting said polysilicon material with cobalt to form a cobalt silicide layer on said polysilicon material; etching said polysilicon material and said cobalt silicide in a pattern which includes transistor gate electrodes; depositing an interlevel dielectric over said polysilicon material; reflowing said interlevel dielectric, using rapid thermal annealing at a peak temperature of at least 950° C., to provide a smoothed upper surface; and etching said interlevel dielectric, to expose said source and body diffusions in multiple locations.

According to another disclosed class of innovative embodiments, there is provided: A device fabrication method, comprising the steps of: fabricating a structure which includes semiconductor source regions surrounded by semiconductor body regions, said body regions including channel regions which are at least partially self-aligned to said source regions; and a layer of polysilicon material overlying said channel regions and capacitively coupled thereto through a gate dielectric; depositing cobalt on said polysilicon material, but not on said source and body regions, and reacting said polysilicon material with cobalt to form a cobalt silicide layer on said polysilicon material; etching said polysilicon material and said cobalt silicide in a pattern which includes transistor gate electrodes; depositing an interlevel dielectric, comprising borophosphosilicate glass, over said polysilicon material; reflowing said interlevel dielectric, using rapid thermal annealing at a peak temperature of at least 925° C., to provide a smoothed upper surface; and etching said interlevel dielectric, to expose said source and body diffusions in multiple locations.

According to another disclosed class of innovative embodiments, there is provided: A process for forming an electronic semiconductor device with a control electrode consisting of self-aligned polycrystalline silicon and silicide, of the type in which said silicide layer is formed above the polycrystalline silicon following definition of active areas of the device formed on a portion of semiconductor material laterally with respect to said control electrode, characterized in that it comprises: a phase involving selective growth of a protective oxide layer above said active areas; subsequent deposition of a metal film, consisting of cobalt, above the polycrystalline silicon and said oxide layer; a heat treatment for obtaining a direct reaction between the metal film and the polycrystalline silicon with formation of the silicide; removal of the metal film above the oxide.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For another example, the specific silicate glass composition and deposition and reflow conditions can be widely varied, as will be immediately apparent to those of ordinary skill in the art.

For another example, although the contact etch in the experimental demonstrations described above was performed by wet, dry etching, to obtain a more sloped profile, but (in view of the better stability of cobalt silicide) it is also possible for the contact etch to be done totally as a dry etch, with a subsequent reflow for contact profiling. Thus in this alternative embodiment two different reflow operations are performed (though not necessarily at the same temperatures).

For example, other aluminum alloys, or other metal composisions, or layered metallization structurs, can optionally be used, subject to the requirements of process compatibility which are well understood by those of ordinary skill in the art.

What is claimed is:

1. A method for fabricating a component in a semiconductor device, comprising:

forming an opening through a first protective layer, a polysilicon layer under the protective layer and a gate oxide layer under the polysilicon layer to expose a channel region in a substrate layer under the polysilicon layer, the opening having a first side adjacent to a first portion of the polysilicon layer and a second side spaced apart from the first side adjacent to a second portion of the polysilicon layer;

constructing a first source region and a second source region in the channel region, the first source region having an exterior edge adjacent to the first portion of the polysilicon layer at the first side of the opening and an interior edge spaced apart from the first portion of the polysilicon layer toward an interior portion of the channel region, and the second source region having an interior edge spaced apart from the interior edge of the first source region toward the interior portion of the channel region and an exterior edge adjacent to the second portion of the polysilicon layer;

fabricating a second protective layer over the first and second source regions to leave portions of the first protective layer over the first and second portions of the polysilicon layer exposed, the first and second layers being selectively removable from the wafer with respect to one another;

selectively removing the first protective layer to expose an upper surface of each of the first and second portions of the polysilicon layer without exposing the first and second source regions; and reacting the upper surface of each of the first and second portions of the polysilicon layer with cobalt to form a cobalt silicide conductor on the first portion of the polysilicon layer adjacent to the exterior edge of the first source region and to form a cobalt silicide conductor on the second portion of the polysilicon layer adjacent to the exterior edge of the second source region without forming a silicide conductor over the interior edges of the first and second source regions.

2. The method of claim 1 wherein the first protective layer comprises silicon nitride and the second protective layer comprises a silicon oxide, and wherein selectively removing the first protective layer comprises selectively etching the silicon nitride with respect to the silicon oxide.

3. The method of claim 1, further comprising:

covering the silicide conductors and the second protective layer with an interlevel dielectric layer;

etching a contact hole through the interlevel dielectric layer and the second protective layer to expose the first and second source regions from approximately the interior edge of the first source region to approximately the interior edge of the second source region without exposing the cobalt silicide conductors;

depositing a metal contact layer, a portion of the metal contact layer filling the contact hole.

4. The method of claim 3 wherein the first protective layer comprises silicon nitride and the second protective layer comprises a silicon oxide, and wherein selectively removing the first protective layer comprises selectively etching the silicon nitride with respect to the silicon oxide.

5. The method of claim 3 wherein covering the silicide conductors and the second protective layer with an interlevel dielectric layer comprises depositing a layer of borophosphate silicon glass over the silicide conductors and the second protective layer.

6. The method of claim 3 wherein depositing the metal contact layer comprises disposing a layer of aluminum at a peak temperature less than 300° C.

7. The method of claim 3, further comprising laying a passivation layer over the metal contact layer.

8. The method of claim 3 wherein covering the silicide conductors and the second protective layer with an interlevel dielectric comprises depositing a layer of borophosphate silicon glass onto the silicide conductors and the second protective layer and reflowing the borophosphate silicon glass at a peak temperature of at least 900° C.

9. A method for fabricating a semiconductor device, comprising:

constructing first and second source regions in a channel region, the first source region having an exterior edge under a first polysilicon gate section and an interior edge spaced apart from the first polysilicon gate section toward an interior portion of the channel region, and the second source region having an exterior edge under a second polysilicon gate section and an interior edge space apart from the second polysilicon gate section toward the interior portion of the channel region, the interior edges of the first and second source regions being spaced apart from one another across at least portions of the interior of the channel region;

covering the interior portion of the channel region and the first and second source regions with a silicon oxide between the first and second polysilicon gate sections; and selectively forming a silicide conductor on an upper surface of each of the first and second polysilicon gate sections without forming a silicide conductor over the interior edges of the first and second source regions.

10. The method of claim 9 wherein the first and second polysilicon gate sections are covered with silicon nitride prior to forming the silicide conductors, and wherein selectively forming the silicide conductors comprises:

selectively removing the silicon nitride from the first and second polysilicon gate sections without removing the silicon oxide between the first and second polysilicon gate sections over the first and second source regions to expose the upper surface of each of the first and second polysilicon gate sections; and reacting the upper surface of each of the first and second polysilicon gate sections with cobalt to form a first cobalt silicide conductor on the first polysilicon gate section and a second cobalt silicide conductor on the second polysilicon gate section.

11. The method of claim 10 wherein selectively removing the silicon nitride from the first and second polysilicon gate sections comprises selectively etching the silicon nitride with respect to the silicon oxide.

12. The method of claim 9, further comprising:

covering the silicide conductors and the silicon oxide over the first and second source regions with an interlevel dielectric layer;

etching a contact hole through the interlevel dielectric layer and the silicon oxide over the first and second source regions to expose the first and second source regions from approximately the interior edge of the first source region to approximately the interior edge of the second source region without exposing the silicide conductors;

depositing a metal contact layer, a portion of the metal contact layer filling the contact hole.

13. The method of claim 12 wherein covering the silicide conductors and the silicon oxide over the first and second source regions with an interlevel dielectric layer comprises depositing a layer of borophosphate silicon glass over the silicide conductors and the silicon oxide.

14. The method of claim 12 wherein depositing the metal contact layer comprises disposing a layer of aluminum at a peak temperature less than 300° C.

15. The method of claim 12, further comprising laying a passivation layer over the metal contact layer.

16. The method of claim 12 wherein covering the silicide conductors and the silicon oxide over the first and second source regions with an interlevel dielectric comprises:

depositing a layer of borophosphate silicon glass onto the silicide conductors and the silicon oxide; and reflowing the borophosphate silicon glass at a peak temperature of at least 900° C.

* * * * *

UNITED STATES PATENT AND TRADEMARK OFFICE
CERTIFICATE OF CORRECTION

PATENT NO. : 6,159,805
DATED : December 12, 2000
INVENTOR(S) : Antonello Santangelo et al.

It is certified that error appears in the above-identified patent and that said Letters Patent is hereby corrected as shown below:

<u>Title page,</u>
Item [73], the assignee should read -- Consorzio per la Ricerca sulla Microelettronica nel Mezzogiorno, Catania, Italy --.

Signed and Sealed this

Sixteenth Day of July, 2002

Attest:

Attesting Officer

JAMES E. ROGAN
Director of the United States Patent and Trademark Office